United States Patent [19]

Sato et al.

[11] Patent Number: 5,048,091

[45] Date of Patent: Sep. 10, 1991

[54] TALKER SPEECH LEVEL CONTROL CIRCUIT FOR TELEPHONE TRANSMITTER BY PIEZOELECTRIC CONVERSION

[75] Inventors: Yasuji Sato, Hachioji; Takeshi Horiuchi, Hino, both of Japan

[73] Assignee: Kabushiki Kaisha Toshiba, Kawasaki, Japan

[21] Appl. No.: 375,604

[22] Filed: Jul. 5, 1989

[30] Foreign Application Priority Data

Jul. 5, 1988 [JP] Japan ................... 63-167443

[51] Int. Cl.⁵ .................................. H03G 3/00
[52] U.S. Cl. ....................... 381/107; 381/109
[58] Field of Search ............... 381/111, 112, 113, 114, 381/115, 107, 109

[56] References Cited

U.S. PATENT DOCUMENTS

| | | | |
|---|---|---|---|
| 3,867,576 | 2/1975 | Simonsen | 381/111 |
| 4,378,467 | 3/1983 | Ferrantelli | 381/111 |
| 4,550,426 | 10/1985 | Gillig et al. | 381/106 |
| 4,602,381 | 7/1986 | Cugnini et al. | 381/106 |
| 4,630,302 | 12/1986 | Kryter | 381/106 |
| 4,658,425 | 4/1987 | Julstrom | 381/111 |
| 4,701,953 | 10/1987 | White | 381/106 |
| 4,759,071 | 7/1988 | Heide | 381/106 |

FOREIGN PATENT DOCUMENTS

| | | |
|---|---|---|
| 657701 | 9/1951 | United Kingdom . |
| 1452564 | 10/1976 | United Kingdom . |
| 2029140 | 3/1980 | United Kingdom . |
| 2070387 | 9/1981 | United Kingdom . |

*Primary Examiner*—Forester W. Isen
*Attorney, Agent, or Firm*—Foley & Lardner

[57] ABSTRACT

A talker speech level control circuit for controlling the level of an electric signal converted from a talker speech, includes an acoustic-electric conversion element for converting an acoustic input signal into an electric signal; a talker speech level detection circuit for detecting whether or not the speech level of an output signal from the conversion element is within an area representing a need for speech level control; and a talker speech level adjustment circuit responsive to a signal detected by the talker speech level detection circuit for controlling the electric signal level in accordance with the detected area within which the talker speech level falls.

3 Claims, 3 Drawing Sheets

TALKER SPEECH LEVEL CONTROL CIRCUIT FOR TELEPHONE TRANSMITTER BY PIEZOELECTRIC CONVERSION

BACKGROUND OF THE INVENTION

The present invention relates to a talker speech level control circuit for a piezoelectric conversion telephone transmitter, capable of making spoken words clear and suppressing unnatural speech quality.

In order to ensure the articulation of speech to be transmitted from a telephone set, it is essential, in general, to consider environmental noises. To ensure the articulation of talker speech, it is necessary to suppress both low and high level signals.

Consider first low level signals. If a voice signal level is lower than a normal speech level and there are environmental noises, the ratio of environmental noises to a voice signal becomes large, to thereby degrading the articulation of spoken words. In such a case, it is desired to suppress the gain for both the environmental noises and the low level voice signals. Namely, if the sensitivity of low level voice signals relative to environmental noises is lowered, the environmental noises are apparently suppressed.

From the viewpoint of the conversion characteristic of a transmitter and limitation of signal level to be fed to a transmission line, it becomes also necessary to suppress the level of high sound pressure signal.

As described above, the talker's speech output is subjected to a compression process with respect to high and low level sound signals to thereby ensure the articulation of talker speech signals.

FIG. 2 is a circuit diagram showing a conventional general telephone set. In FIG. 2, reference numeral 1 represents a telephone line, 2 a handset, 3 a transmitter, and 4 a receiver. An output signal from the transmitter 3 is transmitted via a coupling capacitor 5, transmitter amplifier 6 and hybrid circuit 7 to the telephone line 1. A signal received from the telephone line 1 is supplied via the hybrid circuit 7, receiver amplifier 8 and coupling capacitor 9 to the receiver 4. The hybrid circuit 1 contains therein a talker speech output circuit having a function to regulate the talker signal level to match the impedance of the telephone line 1, and a sidetone attenuation circuit for attenuating an excessively large level sidetone.

There is known a carbon type acoustic-electric conversion element which converts an acoustic signal into an electric signal. FIG. 3 shows an example of the acoustic output characteristic of a carbon type acoustic-electric conversion element relative to an acoustic input signal level. The acoustic output characteristic shown in FIG. 3 indicates that the acoustic outputs for relatively low and high level (sound pressure) input signals are compressed.

More specifically, if a signal in excess of a certain level (sound pressure) is inputted to a carbon type transmitter, the output signal is compressed. A voice signal to be outputted to the telephone line is arranged to be suppressed to the order of 0 dBm (1 mW). The reason for this is that the sufficient dynamic range characteristics of the exchange and repeater at the succeeding stage can be obtained while retaining cost effectiveness, and that the sidetone level can be suppressed not to become too large and the speech level can be ensured while suppressing unnatural speech quality to the extent sufficient for practical use. From this viewpoint, a carbon type transmitter has a proper characteristic of compressing too a large input signal.

In addition, if a signal lower than a certain level (sound pressure) is inputted to a carbon type transmitter, the output signal is compressed. Therefore, the sensitivity to environmental noises is lowered to thus make conversation clear.

As described above, a carbon type transmitter itself has the characteristic that the acoustic outputs for relatively low and high level (sound pressure) input signals are compressed. It is necessary however to adjust the compression characteristic so as to obtain a desired characteristic.

Besides the carbon type transmitter using carbon as an acoustic-electric conversion element, a dynamic type, a ceramic type, an electret type or other type transmitters are also used in some cases.

The acoustic-electric conversion element using other than carbon has a more linear acoustic-electric conversion characteristic than that of the carbon acoustic-electric conversion element. Therefore, in order to ensure the articulation of speech, it is necessary to compress a converted electric signal greater than the carbon type transmitter.

As the means for compressing a high level sound pressure signal, there is a clip circuit (CL) for clipping at a predetermined level the electric signal converted from a talker speech at the hybrid circuit 7 shown in FIG. 2. The clip circuit is constructed of clamp diodes for example. If a voice signal to be transmitted becomes too large, the clamp diodes become conductive to accordingly perform a clip operation. At this time, the impedance of a balancing circuit (not shown) constituting the sidetone attenuator shown in FIG. 2 becomes unbalanced so that the sidetone attenuation operation becomes abnormal to thereby degrade the clearness of voices. Thus, while compressing a high level sound pressure signal, the impedance matching with the telephone line is lost, causing unnatural speech quality.

As described above, in a conventional telephone set, the compression process for an electric signal converted by the acoustic-electric conversion element is carried out in accordance with the characteristic specific to the conversion element. In this case, however, the sidetone attenuation effects are degraded or other problems occur such as unclearness of speech depending upon the voice level.

SUMMARY OF THE INVENTION

It is an object of the present invention to provide a talker speech level control circuit which compresses an electric output converted by an acoustic-electric conversion element in accordance with an input sound pressure level and is capable of eliminating unnatural speech quality and ensuring a speech of high articulation.

It is another object of the present invention to provide a talker speech level control circuit which sets a proper compression process response time in accordance with an input sound pressure level and is capable of ensuring a speech of high articulation.

It is a further object of the present invention to provide a talker speech level control circuit which sets a level determining the compression process characteristic in accordance with the acoustic-electric conversion element so that the compression process suitable for the conversion characteristic can be performed while ensuring a speech of high articulation.

In order to achieve the above objects, the present invention provides a talker speech level control circuit for controlling the level of an electric signal converted from a talker speech, comprising:

an acoustic-electric conversion element for converting an acoustic input signal into an electric signal;

a talker speech level detection circuit for detecting whether or not if the speech level of an output signal from said conversion element is within an area representing a need of a speech level control; and a talker speech level adjustment circuit responsive to a signal detected by said talker speech level detection circuit for controlling said electric signal level in accordance with the detected area within which said talker speech level falls.

DETAILED DESCRIPTION OF THE PREFERRED EMBODIMENTS

Figure 1:
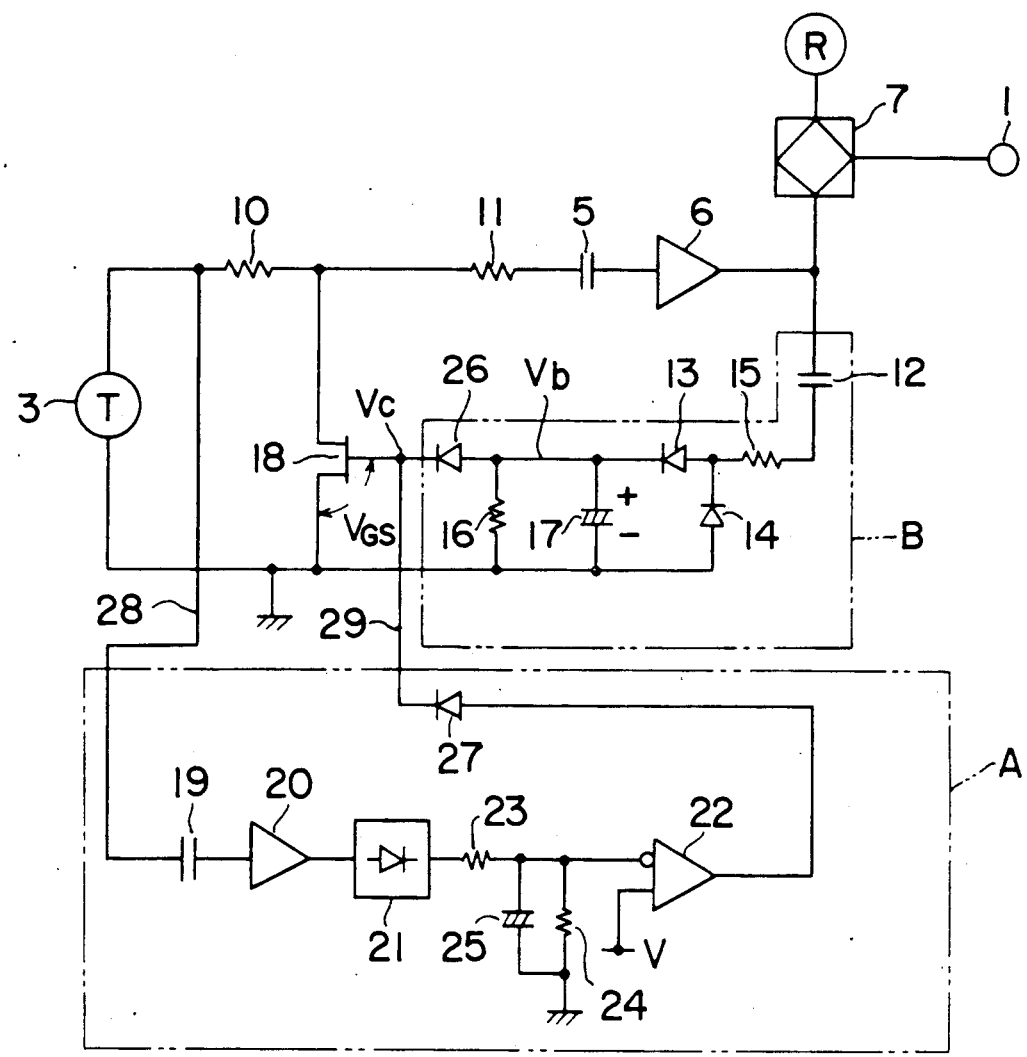
FIG. 1 is a circuit diagram showing an embodiment of this invention.
Figure 2:
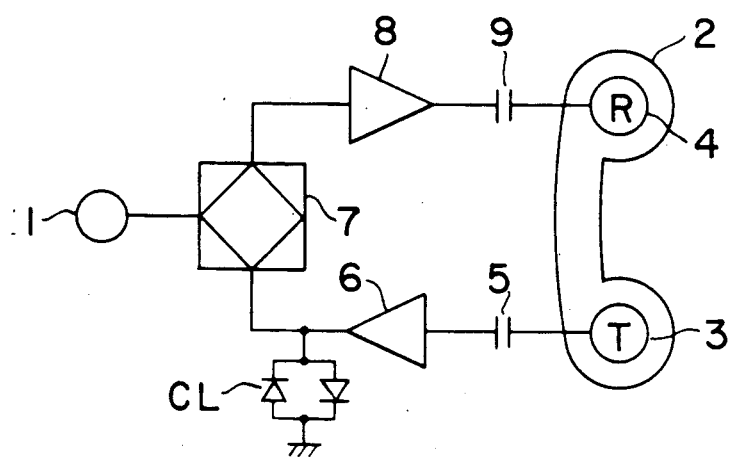
FIG. 2 is a schematic block diagram showing a telephone set of general structure using a conventional carbon type transmitter.

FIG. 1 is a circuit diagram showing a telephone set having a talker speech level control circuit of this invention.

Referring to FIG. 1, a transmitter 3 is connected via resistors 10 and 11, coupling capacitor 5 and transmitter amplifier 6 to the input terminal of a hybrid circuit 7.

A High Sound Pressure Level Control Circuit

Connected to the output terminal of the transmitter amplifier 6 is a high sound pressure level control circuit B. In this control circuit B, the output terminal of the transmitter amplifier 6 is connected to a coupling capacitor 12 which is connected to one terminal of a resistor 15. The other terminal of the resistor 15 and the anode of a diode 13 and the cathode of a diode 14 are connected in common. The cathode of the diode 13 is connected to the anode of a diode 26 whose cathode is connected to the gate of a field effect transistor (FET). The drain of FET 18 is connected to the interconnection between the resistors 10 and 11, and the source thereof is grounded. The anode of the diode 14 is grounded. A parallel circuit of a resistor 16 and capacitor 17 is connected between an interconnection of the diodes 13 and 26 and the ground.

The resistors 15 and 16 and capacitor 17 constitute a time constant circuit which determines the time constants ($\tau_1$ and $\tau_2$) of leading and trailing edge signals supplied to the high sound pressure level control circuit B. The leading edge time constant $\tau_1$ is determined by the resistor 15 and capacitor 17, and is preferably about 20 ms. The trailing edge time constant $\tau_2$ is determined by the resistor 16 and capacitor 17, and is preferably about 300 ms. By setting the time constants at such values, unclearness of the start and end of a spoken word can be avoided.

With the high sound pressure level control circuit B constructed as above, a portion of the output from the transmitter amplifier 6 is applied via the capacitor 12 to the rectifier circuit constructed of the diodes 13 and 14 and capacitor 17 so that a d.c. voltage corresponding to the level of a speech signal outputted from the transmitter 3 is generated at the cathode of the diode 26, the d.c. voltage being applied to the gate of FET 18 as the gate d.c. bias.

The resistance of the drain-source path of FET 18 lowers in accordance with the gate voltage if the gate voltage exceeds a predetermined value (e.g., threshold value 0.8 V). Therefore, the output from the transmitter 3 is voltage divided in accordance with the ratio of the resistor 10 value to the FET drain-source path resistance value, and the attenuated output is supplied to the transmitter amplifier 6.

Figure 3:
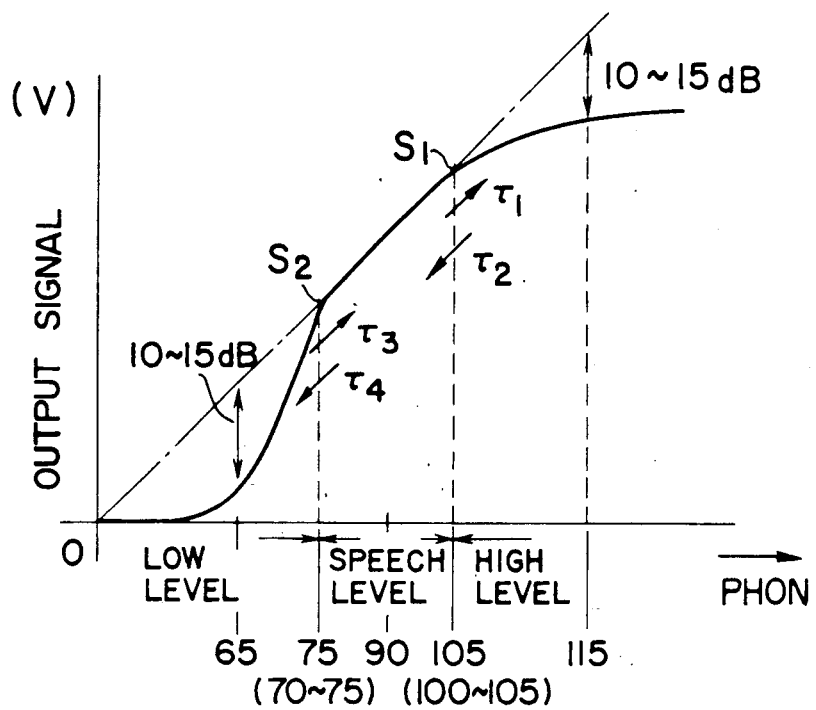
FIG. 3 is a graph showing the acoustic-electric conversion characteristic of a carbon type transmitter.

Specifically, if the level of a signal from the transmitter 3 is large enough to exceed the gate threshold voltage, for example, in excess of S1 level (about 105 phon) shown in FIG. 3, then the signal level supplied to the transmitter amplifier 6 is attenuated correspondingly. Therefore, an input to the hybrid circuit 7 is lowered to thereby suppress the talker speech level to the transmitter amplifier 6.

A Low Sound Pressure Level Control Circuit

Connected to the output terminal of the transmitter 3 is a low sound pressure level control circuit A. This control circuit A includes a coupling capacitor 19, pre-amplifier 20, rectifier 21, time constant circuit constructed of resistors 23 and 24 and a capacitor 24, and a differential amplifier 22 with inverted and non-inverted input terminals. The output signal from the transmitter 3 is applied via the coupling capacitor 19, pre-amplifier 20, rectifier 21, and time constant circuit, to the inverted terminal of the amplifier 22 whose non-inverted terminal is supplied with a predetermined voltage V. The amplifier 21 therefore outputs a difference between the voltages supplied to both the input terminals, the difference voltage being supplied via a diode 27 to the gate of FET 18 as the d.c. gate bias voltage. Thus, the lower the output signal level at the transmitter is, the higher the output voltage from the amplifier 22 becomes.

Specifically, if the level of a signal from the transmitter 3 is larger than S2 (about 75 phon) shown in FIG. 3, then the output from the amplifier 22 takes a negative value so that no gate bias voltage is applied to the gate of FET 18. Alternatively, if the level of a signal from the transmitter 3 is smaller than S2, an output voltage corresponding to the transmitter 3 signal level is applied to the gate of FET 18. Therefore, if the level of an output signal from the transmitter 3 lowers enough to have a gate bias in excess of the threshold value, the output signal to the transmitter amplifier 6 is attenuated correspondingly. Therefore, an input to the hybrid circuit 7 is lowered to thereby suppress the talker speech level to the transmitter amplifier 6.

Figure 4:
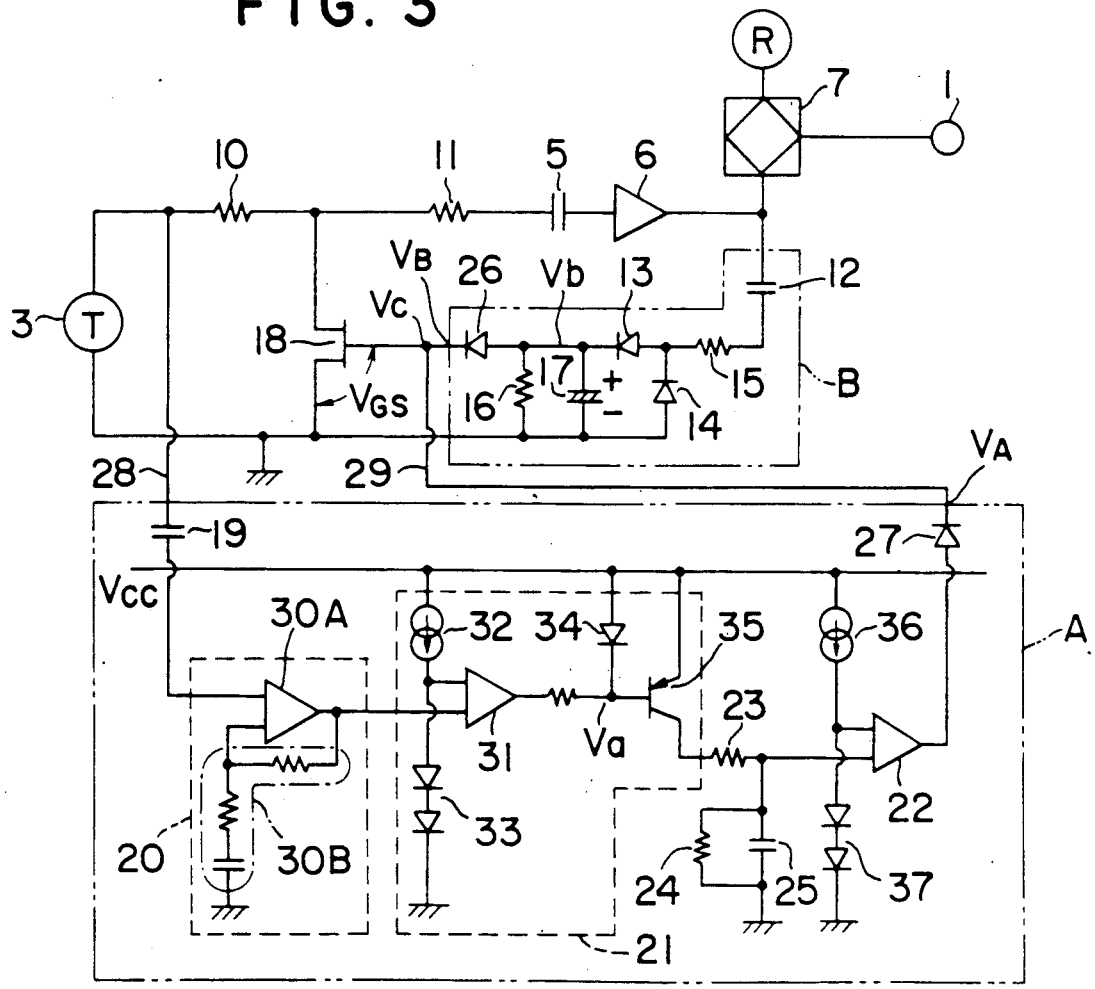
FIG. 4 is a circuit diagram showing in more particular the high sound pressure level control circuit A shown in FIG. 1.

FIG. 4 is a circuit diagram which shows a more particular circuit arrangement of the low sound pressure level control circuit A shown in FIG. 1. In FIG. 4, similar elements to those shown in FIG. 1 are represented by using identical reference numerals.

In the control circuit A shown in FIG. 4, a preamplifier 20 is constructed of an amplifier 30A and high-pass filter 30B. The low frequency component of an input signal to the control circuit A is removed by a capacitor and the high frequency component thereof is removed by the high-pass filter 30B. Therefore, the amplifier 30A amplifies only the input signal having a frequency component suitable for the telephone set. An output from the pre-amplifier 20 is supplied to a rectifier circuit 21.

The rectifier circuit 21 is constructed of a comparator 31 which is supplied with a reference voltage from a reference voltage circuit constructed of a constant current source 32 and diode train 33. With this circuit arrangement, the rectifier circuit 21 picks up an input signal larger than the reference voltage, and supplies it to a phase inverter circuit 35.

The phase inverter circuit 35 is biased by a diode 34 so that the circuit 35 outputs a signal whose phase is an inversion of the input signal. Namely, a high level output is obtained for a low level input signal, and a low level output is obtained for a high level input signal. An output from the phase inverter circuit 35 is supplied to a time constant circuit constructed of resistors 23 and 24 and capacitor 25.

Similar to the high sound pressure level control circuit B, this time constant circuit provides a leading edge time constant ($\tau_3$ shown in FIG. 3) determined by the resistor 23 and capacitor 25 to thereby prevent the start portion of a word from being lost, and provides a trailing edge time constant ($\tau_4$ shown in FIG. 3) determined by the resistor 24 and capacitor 25 to thereby prevent the end portion of a word from being lost. An output from the time constant circuit is supplied to a level discrimination circuit 22.

In FIG. 3, symbols $\tau_1$ to $\tau_4$ represent the transition time constants of the non-linear characteristic at the higher and lower level than the normal sound pressure level having the linear characteristic.

The level discrimination circuit 22 discriminates an output of the phase inverter circuit 35 delayed by a certain time at the time constant circuit. The level discrimination circuit 22 judges the level of a high level signal outputted from the phase inverter circuit 35 when the input signal thereto takes a low level. If the judged level is smaller than a predetermined level, a high level output is applied via a diode 27 to the gate of FET 18 so that the drain-source resistance lowers to thereby make low the signal level supplied to the transmitter amplifier 6.

Figure 5A:
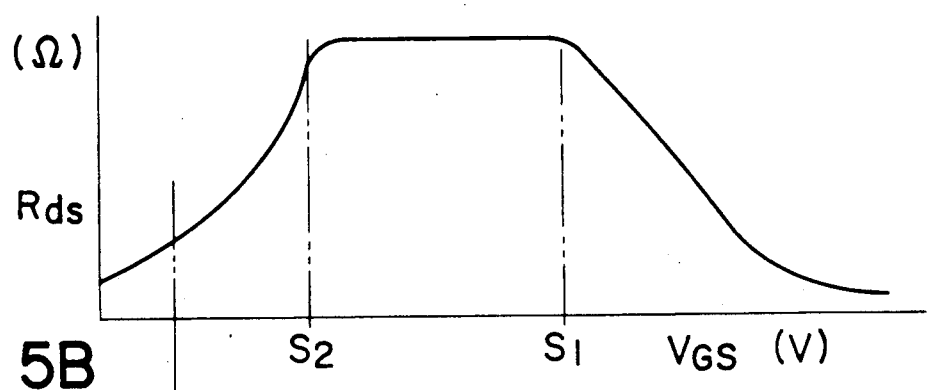
FIG. 5 shows the outputs of the low and high sound pressure level control circuits, and the operation characteristic of FET 18.
Figure 5B:
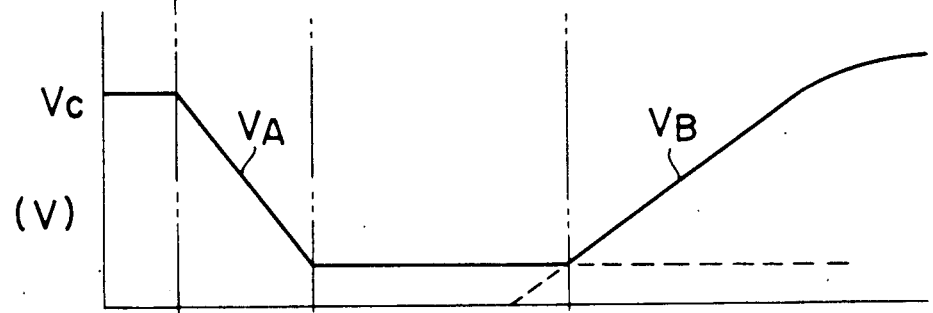
Figure 5C:
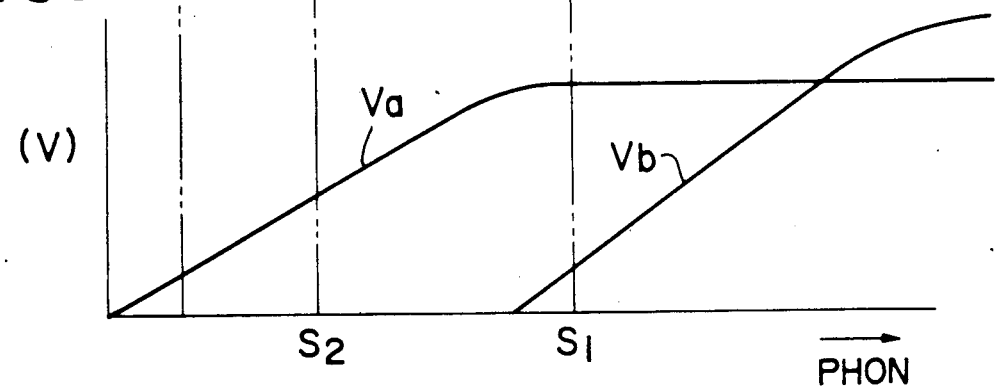

FIG. 5 shows the outputs of the high and low sound pressure level control circuits B and A, and the operation characteristic of FET, for the comparison purpose. In the figure, the uppermost abscissa represents a gate-source voltage $V_{GS}$ of FET, the uppermost ordinate represents the drain-source resistance Rds thereof, the other abscissae represent a sound pressure level (phon), the middle ordinate represents Vc composed of an output $V_A$ from the low sound pressure level control Circuit A and an output $V_B$ from the high sound pressure level control circuit B and lowermost ordinate represents a detection output Va from the low sound pressure level control circuit A and a detection output Vb from the high sound pressure level control circuit B.

As seen from the uppermost curve shown in FIG. 5, the drain-source resistance Rds of FET lowers both for the excessively large voice signal level and for too the small voice signal level. This means that the output $V_A$ from the low sound pressure level control circuit A takes a high level for a low sound pressure level, lowers near the normal sound pressure level and takes a minimum level at the normal sound pressure level, whereas the output $V_B$ from the high sound pressure level control circuit B takes a considerably low level before the high sound pressure level reaches the normal sound pressure level and gradually increases the level after the high sound pressure level leaves the normal sound pressure level.

The preferred embodiments of this invention have been described above. It is to be noted that the invention is not limited thereto.

For example, although an FET is used as the variable resistance element, other elements such as a transistor may also be used if it presents the similar variable resistance characteristic.

Further, in the above embodiments, although the variable resistance element is connected in parallel with the transmitter to lower the resistance in accordance with the transmitter output level and hence attenuate the speech signal to the transmitter amplifier, the variable resistance element may be connected in series to the transmitter to increase the resistance in accordance with the transmitter output level and hence attenuate the speech level to the transmitter amplifier.

Furthermore, in the above embodiments, although both the high and low sound pressure level control circuits B and A are provided, either one of them may be omitted in some cases.

As appreciated from the foregoing description of the invention, even a transmitter having a substantially linear acoustic-electric characteristic can be changed to a transmitter having a non-linear acoustic-electric characteristic such as of a carbon type transmitter, by compressing the output of a transmitter.

According to the present invention, the relationship between an input sound pressure signal to the transmitter and an output signal to the transmitter amplifier becomes linear if the sound pressure level is within the region between two predetermined levels, and non-linear if the sound pressure level is outside of the region because the output signal to the transmitter amplifier is greatly attenuated.

Further, the output signal to the transmitter amplifier is attenuated without giving any distortion of voice signals.

Furthermore, the output signal to the transmitter amplifier is attenuated continuously over the whole sound pressure level region as desired so that noises are not intermittently generated during speech or at the stop of speech.

Still further, the output signal to the transmitter amplifier can be attenuated to suppress too large a signal without losing the impedance matching of the circuit with the telephone line.

We claim:

1. A talker speech level control circuit for controlling the level of an electric signal converted from a talker speech, comprising:
   an acoustic-electric conversion element for converting an acoustic input signal into an electric signal;
   means for transmitting the electric signal output from said conversion element to a communication line;
   an amplifier provided in said transmission means for amplifying the electric signal outputted from said conversion element;
   means for attenuating the electric signal applied to said amplifier in response to both a first compression control signal and a second compression control signal;

a first compression control means which detects that the level of the electric signal outputted from said conversion element is in a first region lower than an ordinary speech signal region for outputting the first compression control signal to said attenuating means; and a second compression control means for detecting if the level of the electric signal outputted from said conversion element is in a second region higher than the ordinary speech signal region for outputting the second compression control signal to said attenuating means, the second compression control means including a first time-constant circuit determining a transition time required when the level of the electric signal is shifted from the ordinary speech region to the second region, and a second time-constant circuit determining a transition time required when the level of the electric signal is shifted from said second region to the ordinary speech signal region, and the time constant of said first time-constant circuit is smaller than that of said second time-constant circuit, so that the losing of a high-level initial portion or an ending portion of a word of the talker speech is avoided;

whereby the level of noises transmitted to the communication line is suppressed by carrying out compression to the electric signal in either of the first and second regions.

2. The talker speech level control circuit according to claim 1, wherein said first compression control means includes a third time-constant circuit determining a transition time required when the level of the electric signal is shifted from the first region to the ordinary speech signal region, and a fourth time-constant circuit for determining a transition time required when the level of the electric signal is shifted from the ordinary speech signal region to the first region, the time constant of said third time-constant circuit being smaller than that of said fourth time-constant circuit, so that losing a low-level initial portion or ending portion of a word of the talker speech is avoided.

3. The talker speech level control circuit according to claim 1, wherein said first region and said second region of signal level are selected in accordance with properties of said acoustic-electric conversion element.

* * * * *